United States Patent
Cha

(10) Patent No.: US 7,411,839 B2
(45) Date of Patent: Aug. 12, 2008

(54) DATA INPUT CIRCUIT OF SEMICONDUCTOR MEMORY DEVICE AND DATA INPUT METHOD THEREOF

(75) Inventor: Jae Hoon Cha, Kyeongki-do (KR)

(73) Assignee: Hynix Semiconductor Inc., Kyoungki-do (NL)

( * ) Notice: Subject to any disclaimer, the term of this patent is extended or adjusted under 35 U.S.C. 154(b) by 215 days.

(21) Appl. No.: 11/480,877

(22) Filed: Jul. 6, 2006

(65) Prior Publication Data

US 2007/0127296 A1    Jun. 7, 2007

(30) Foreign Application Priority Data

Dec. 7, 2005    (KR) ...................... 10-2005-0118980

(51) Int. Cl.
*G11C 7/10* (2006.01)
(52) U.S. Cl. .............. 365/189.05; 365/193; 365/189.02
(58) Field of Classification Search ............ 365/180.05, 365/193, 189.02
See application file for complete search history.

(56) References Cited

U.S. PATENT DOCUMENTS

| | | | | |
|---|---|---|---|---|
| 4,970,687 A | * | 11/1990 | Usami et al. ........... | 365/189.16 |
| 5,936,905 A | | 8/1999 | Proebsting | |
| 6,134,169 A | * | 10/2000 | Tanaka ....................... | 365/222 |
| 6,807,108 B2 | * | 10/2004 | Maruyama et al. ..... | 365/189.05 |
| 7,031,205 B2 | * | 4/2006 | Han et al. .................... | 365/193 |

FOREIGN PATENT DOCUMENTS

| | | |
|---|---|---|
| KR | 1020010047531 | 6/2001 |
| KR | 1020030049187 | 6/2003 |
| KR | 1020030058254 | 7/2003 |

* cited by examiner

*Primary Examiner*—Tuan T Nguyen
(74) *Attorney, Agent, or Firm*—Lowe Hauptman Ham & Berner LLP

(57) ABSTRACT

A data input circuit of a semiconductor memory device and a data input operating method thereof, in which data input margin can be secured. The data input circuit includes a strobe buffer that receives an external data strobe signal in response to a data input signal and outputs a data strobe signal, data input buffers that receive external input data, respectively, in response to the data input signal and output input data, respectively, an input controller that generates input latch signals and strobe pulse signals based on the data strobe signal, an output latch signal generator that generates an output latch signal in response to a clock signal and a write instruction, latches that latch the input data, respectively, in response to the input latch signals and output latch data, respectively, multiplexers that receive the latch data, respectively, and output multiplexed data, respectively, and data sense amplifiers that sense and amplify the multiplexed data, respectively, in response to the strobe pulse signals and output amplified data to global I/O lines, respectively, in response to the output latch signal.

23 Claims, 7 Drawing Sheets

DATA INPUT CIRCUIT OF SEMICONDUCTOR MEMORY DEVICE AND DATA INPUT METHOD THEREOF

BACKGROUND

1. Field of the Invention

The present invention generally relates to semiconductor memory devices, and more particularly, to a data input circuit of a semiconductor memory device.

2. Discussion of Related Art

In general, a data input circuit of a semiconductor memory device receives input data from an external device in synchronization with a data strobe signal. As described above, the data input circuit further receives the data strobe signal other than the externally input data from the external device.

FIG. 1 is a schematic block diagram of a data input circuit, a data output circuit, and an internal circuit of a semiconductor memory device in the related art.

Referring to FIG. 1, a data input circuit 10 and a data output circuit 30 are connected to an internal circuit 20 through a Global Input and Output (GIO) line 40. Though not shown in FIG. 1, the internal circuit 20 includes a core circuit having memory cells. FIG. 1 shows an example in which the data input circuit 10 receives 8-bit external input data DIN.

The data input circuit 10 includes a strobe buffer 11, a latch signal generator 12, a sensing controller 13, a data input buffer 14, a latch 15, a multiplexer 16, and an I/O Sense Amplifier (IOSA) 17.

As shown in FIGS. 1 and 2, the latch 15 latches bits of the input data DIN, which are serially inputted from the data input buffer 14, in response to latch control signals LCTL1 to LCTL8 received from the latch signal generator 12, and outputs latched data DLAT1 to DLAT8 in parallel. At this time, since the latch signal generator 12 generates the latch control signals LCTL1 to LCTL8 in synchronization with a strobe signal DQS, points of time at which the latch control signals LCTL1 to LCTL8 are toggled respectively may be varied when a point of time at which the strobe signal DQS is inputted to the data input circuit 10 is changed.

In more detail, skew may occur in the strobe signal DQS due to variation in parasitic capacitance existing between the semiconductor memory device including the data input circuit 10 and an external device (not shown) for transmitting the strobe signal DQS to the semiconductor memory device, or variation in PVT (i.e., process, voltage, and temperature) of the semiconductor memory device and the external device.

If skew is generated in the strobe signal DQS as described above, the point of time at which the strobe signal DQS is inputted to the data input circuit 10 may be varied. In other words, the strobe signal DQS may not be synchronized with a clock signal (i.e., a system clock signal CLK accurately and the phase of the strobe signal DQS may be faster or slower that the phase of the clock signal CLK.

For the purpose of the stabilized write operation of the semiconductor memory device, however, it is required that the strobe signal DQS be inputted to the strobe input buffer 11 within a predetermined time from a point of time at which a write instruction WRT is inputted to the semiconductor memory device. In other words, a point of time at which a first rising edge is generated after the strobe signal DQS is toggled must be included within the predetermined time.

To this end, in the specification of semiconductor memory devices, the range of a time (tDQSS); from a write command to a first rising edge of DQS) from a point of time at which the write instruction WRT is inputted to the semiconductor memory device to a point of time at which at which the first rising edge of the strobe signal DQS is generated is defied as a minimum time (tDQSSmin) and a maximum time (tDQSSmax).

When the time (tDQSS) of the strobe signal DQS is the minimum (i.e., tDQSSmin), the phase of the strobe signal DQS is t1 earlier than that of the clock signal CLK, as shown in FIG. 2. In contrast, when the time (tDQSS) of the strobe signal DQS is the maximum (i.e., tDQSSmax), the phase of the strobe signal DQS is t2 slower than that of the clock signal CLK. Consequently, a point of time at which the latch 15 outputs the latched data DLAT1 to DLAT8 when the time (tDQSS) is the minimum (i.e., tDQSSmin) is ΔT earlier than a point of time at which the latch 15 outputs the latched data DLAT1' to DLAT8' when the time (tDQSS) is the maximum (i.e., tDQSSmax).

As a result, a point of time at which the multiplexer 16 receives the latched data DLAT1 to DLAT8 and outputs data DMLX1 to DMLX8 to the IOSA 17 is earlier than a point of time at which the multiplexer 16 receives latched data DLAT1' to DLAT8' and outputs data DMLX1' to DMLX8' to the IOSA 17.

However, the IOSA 17 operates in synchronization with a sensing control signal DINST synchronized with the clock signal CLK regardless of the time (tDQSS). Accordingly, a point of time at which the IOSA 17 begins operating is fixed constantly. In this case, the clock signal CLK is generated by an internal clock generator (not shown) included in the semiconductor memory device having the data input circuit 10. Therefore, the clock signal CLK is stable and skew rarely occurs in the clock signal CLK.

As a result, although a point of time P1 or P2 at which the multiplexer 16 outputs the data DMLX1 to DMLX8 or DMLX1' to DMLX8' when the time (tDQSS) is the minimum (i.e., tDQSSmin) or the maximum (i.e., tDQSSmax) is changed, a point of time P5 at which the IOSA 17 begins performing the sensing and amplification operations (i.e., a point of time at which the sensing control signal DINST is enabled) is fixed to the clock signal CLK.

As a result, as shown in FIG. 2, a time t3 from the point of time P1 to the point of time P5 is longer than a time t4 from the point of time P2 to the point of time P5. Furthermore, times t5, t6 from a point of time P6 at which the sensing control signal DINST is disabled to points of time P3, P4 at which the data DMLX1 to DMLX8, DMLX1' to DMLX8' are respectively shifted are varied due to the difference between the times t3, t4. If the times t3 and t4 or t5 and t6 are varied as described above, data input margin cannot be secured.

As described above, the data input circuit 10 operates the IOSA 17 in synchronization with the clock signal CLK regardless of the time (tDQSS) of the data strobe signal DQS. Accordingly, a problem arises because data input margin cannot be secured stably.

The problem may become more profound in high-speed semiconductor memory devices operating at a relatively high frequency, such as Graphic Double Data Rate (GDDR) 4 Synchronous Dynamic Random Access Memory (SDRAM).

In other words, the high-speed semiconductor memory devices have data input margin lower than that semiconductor memory devices operating at a low frequency because the set-up and hold time margin of input data is reduced. The reduction in the data input margin may generate write operation fail of the semiconductor memory devices.

SUMMARY OF THE INVENTION

An embodiment of the present invention is that it provides a data input circuit of a semiconductor memory device, in which it can secure a data input margin stably by controlling an operating start point of the sense amplifier circuit based on the data strobe signal.

Another embodiment of the present invention is that it provides a data input method of a semiconductor memory device, in which it secure a data input margin stably by controlling an operating start point of the sense amplifier circuit based on the data strobe signal.

According to an aspect of the present invention, there is provided a data input circuit of a semiconductor memory device, including a strobe buffer, data input buffers, an input controller, an output latch signal generator, latches, multiplexers, and data sense amplifiers. The strobe buffer receives an external data strobe signal in response to a data input signal and outputs a data strobe signal. The data input buffers receive external input data, respectively, in response to the data input signal and output input data, respectively. The input controller generates input latch signals and strobe pulse signals based on the data strobe signal. The output latch signal generator generates an output latch signal in response to a clock signal and a write instruction. The latches latch the input data, respectively, in response to the input latch signals and output latch data, respectively. The multiplexers receive the latch data, respectively, and output multiplexed data, respectively. The data sense amplifiers sense and amplify the multiplexed data, respectively, in response to the strobe pulse signals and output amplified data to global I/O lines, respectively, in response to the output latch signal.

According to another aspect of the present invention, there is provided a data input circuit of a semiconductor memory device, including first to $N^{th}$ strobe buffers, first to $N^{th}$ input controllers, an output latch signal generator, and first to $N^{th}$ data input units. The first to $N^{th}$ strobe buffers receive first to $N^{th}$ (N is an integer) external data strobe signals, respectively, in response to a data input signal and output first to $N^{th}$ data strobe signals, respectively. The first to $N^{th}$ input controllers generate first to $N^{th}$ input control signals, respectively, based on the first to $N^{th}$ data strobe signals, respectively. The output latch signal generator generates an output latch signal in response to a clock signal and a write instruction. The first to $N^{th}$ data input units receive first to $N^{th}$ groups of external input data, respectively, in response to the data input signal, latch and sense the first to $N^{th}$ groups of the external input data, respectively, in response to the first to $N^{th}$ input control signals, respectively, and output first to $N^{th}$ groups of amplified data to first to $N^{th}$ groups of global I/O lines, respectively.

According to further another aspect of the present invention, there is provided a data input method of a semiconductor memory device, including the steps of receiving an external data strobe signal in response to a data input signal and outputting a data strobe signal; receiving external input data, respectively, in response to the data input signal and outputting the input data, respectively; generating input latch signals and strobe pulse signals based on the data strobe signal; latching the input data, respectively, in response to the input latch signals and outputting latch data, respectively; receiving the latch data, respectively, and outputting multiplexed data, respectively; sensing and amplifying the multiplexed data, respectively, in response to the strobe pulse signals and outputting amplified data; generating an output latch signal in response to a clock signal and a write instruction; and outputting the amplified data to global I/O lines, respectively, in response to the output latch signal.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The present invention will now be described in detail in connection with certain exemplary embodiments with reference to the accompanying drawings.

Figure 1:
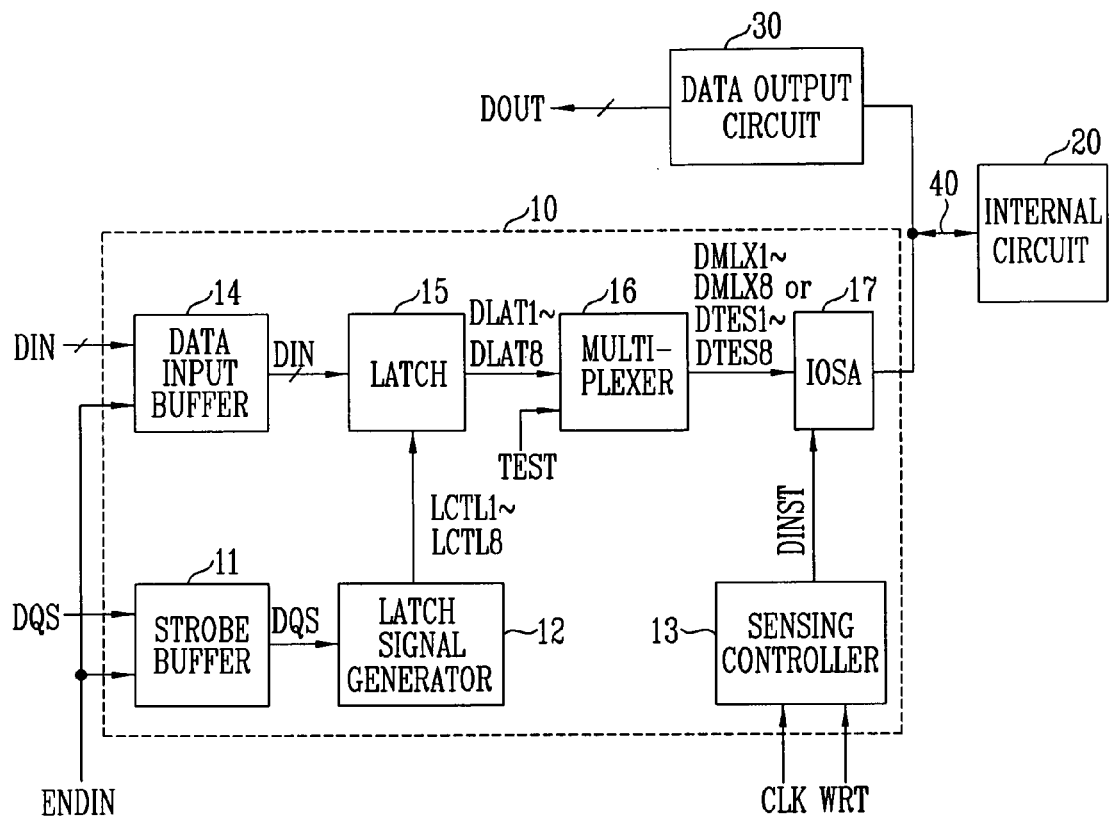
FIG. 1 is a schematic block diagram of a data input circuit, a data output circuit, and an internal circuit of a semiconductor memory device in the related art.
Figure 2:
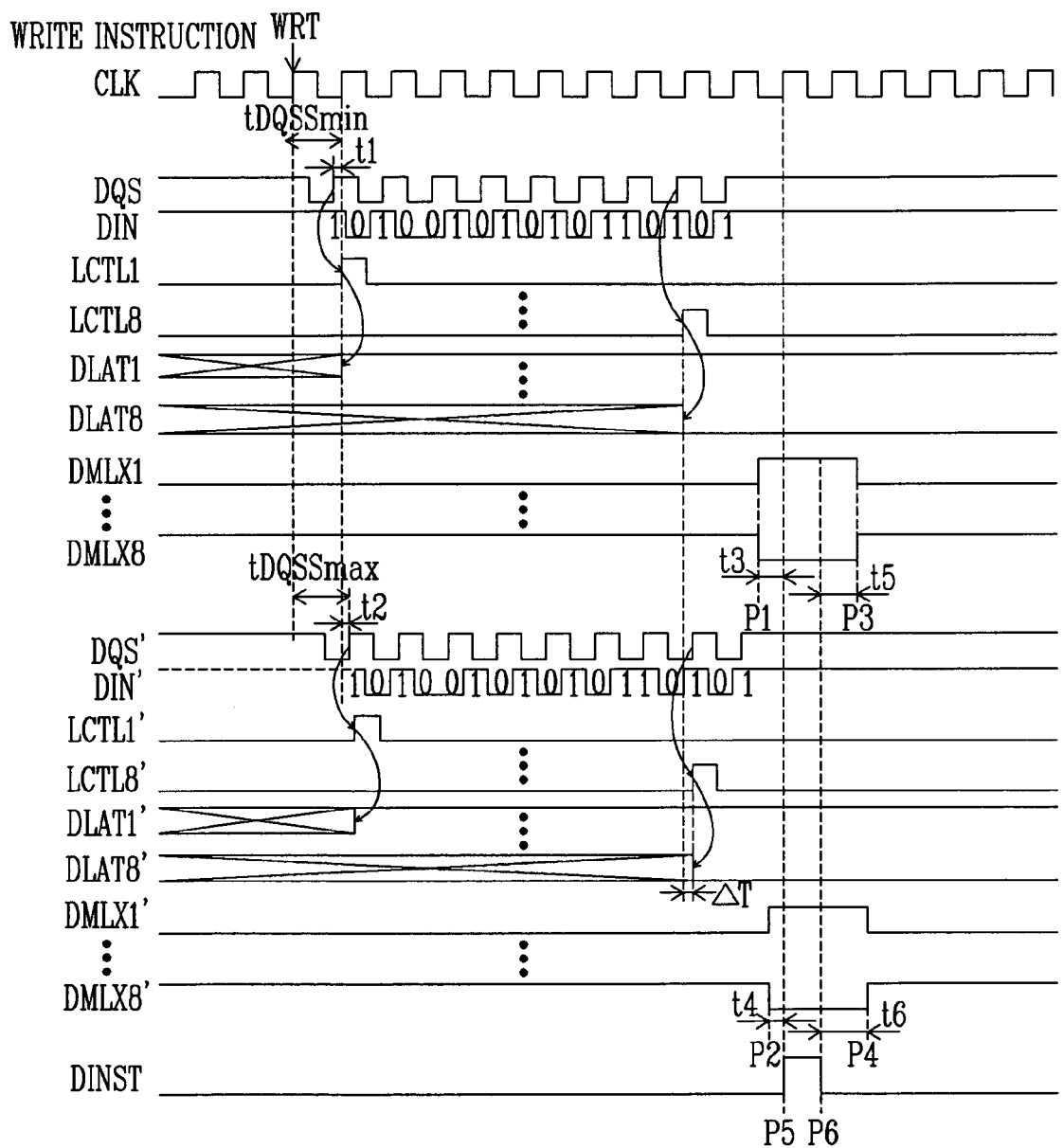
FIG. 2 is a timing diagram of signals related to the operation of the data input circuit shown in FIG. 1.
Figure 3:
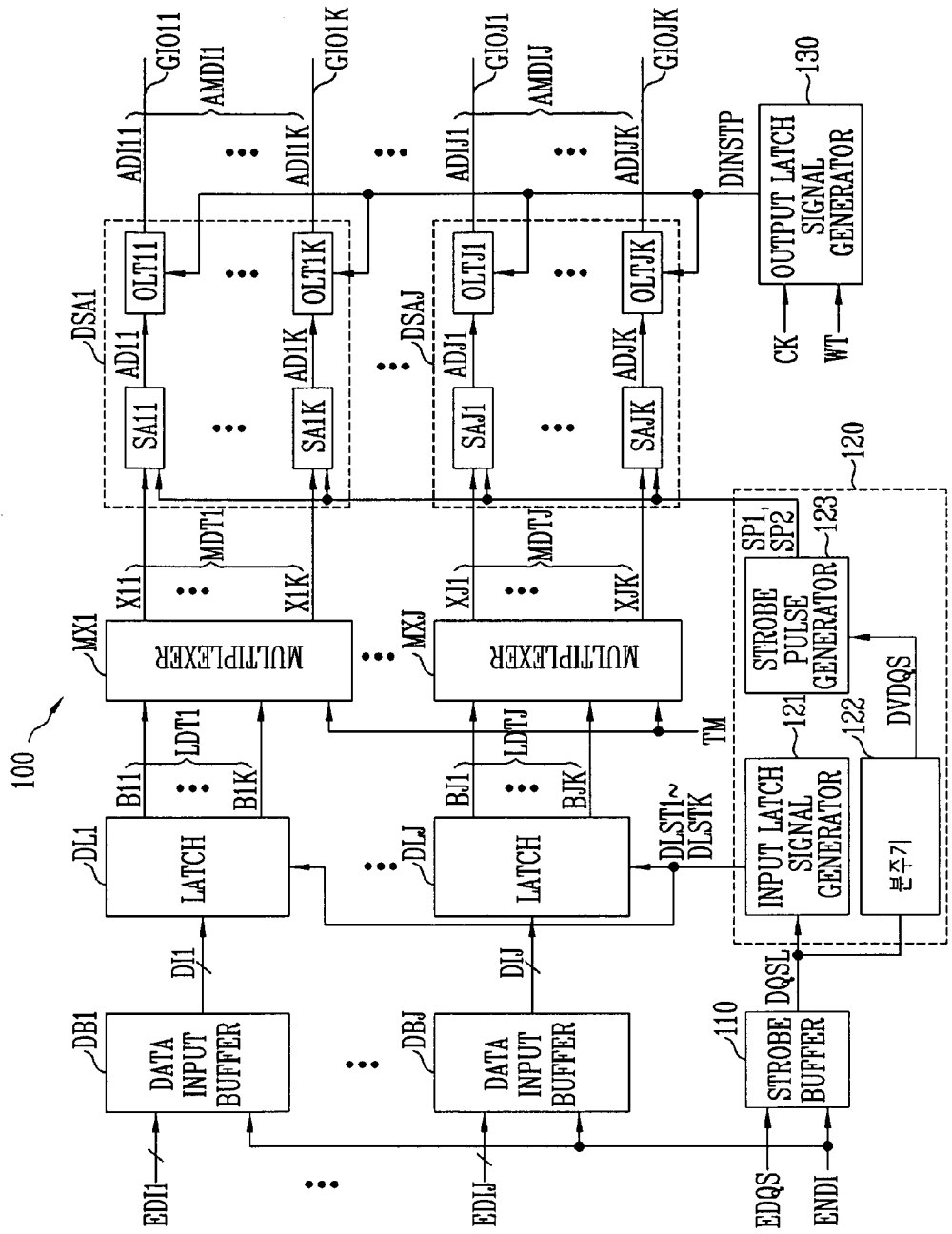
FIG. 3 is a schematic block diagram of a data input circuit of a semiconductor memory device according to an embodiment of the present invention.

FIG. 3 is a schematic block diagram of a data input circuit of a semiconductor memory device according to an embodiment of the present invention.

Referring to FIG. 3, a data input circuit 100 includes a strobe buffer 110, an input controller 120, an output latch signal generator 130, data input buffers DB1 to DBJ (J is an integer), latches DL1 to DLJ, multiplexers MX1 to MXJ, and data sense amplifiers DSA1 to DSAJ.

The strobe buffer 110 receives an external data strobe signal EDQS in response to a data input signal ENDI and outputs a data strobe signal DQSL. In more detail, the strobe buffer 110 converts a voltage level of the external data strobe signal EDQS into a CMOS logic level (i.e., a voltage level suitable for the operation of the input controller 120) and outputs the data strobe signal DQSL having a converted voltage level.

The input controller 120 includes an input latch signal generator 121, a divider 122, and a strobe pulse generator 123.

Figure 5:
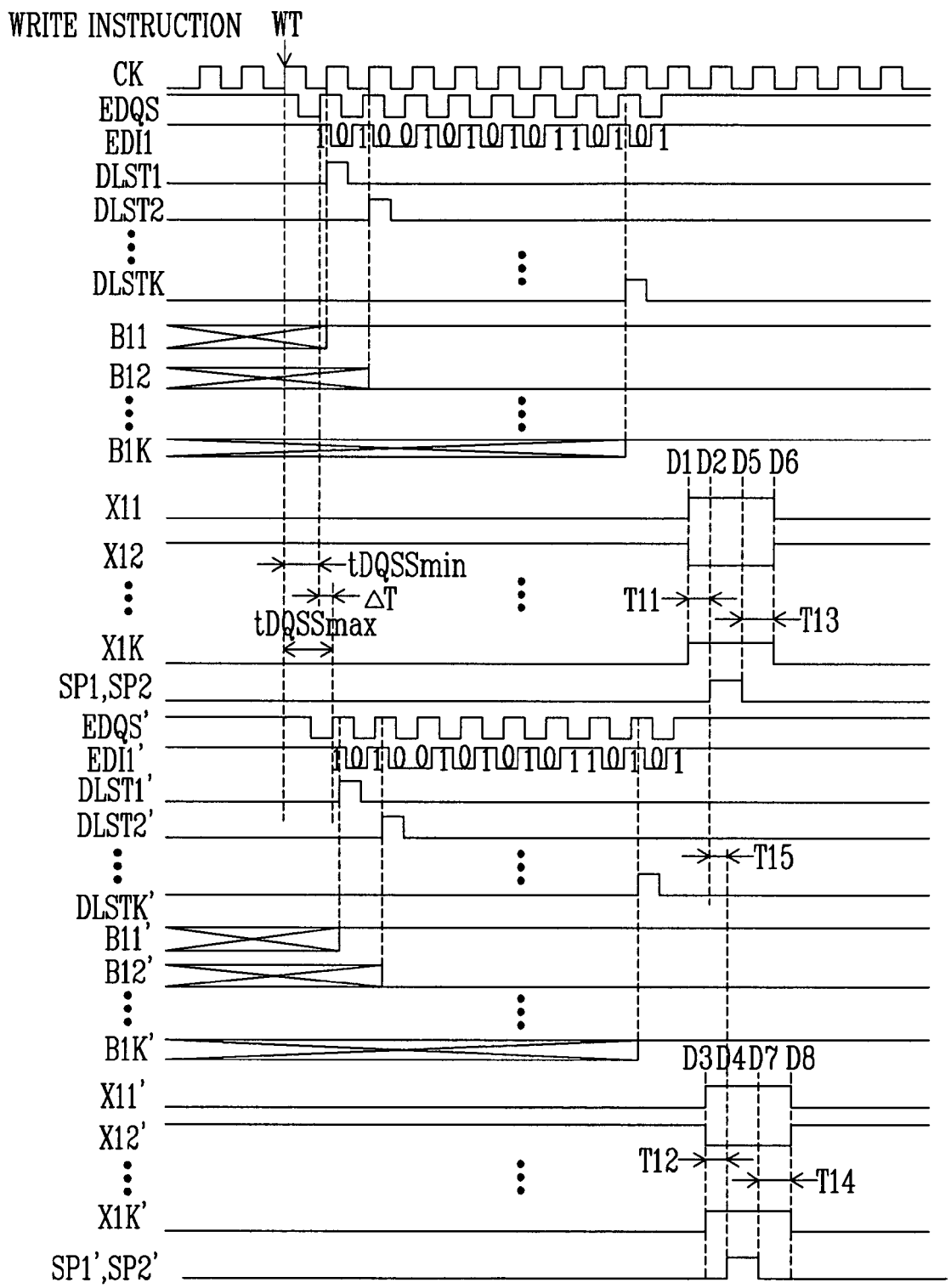
FIG. 5 is a timing diagram of signals related to the operation of the data input circuit shown in FIG. 3 according to an embodiment of the present invention.

The input latch signal generator 121 generates input latch signals DLST1 to DLSTK (K is an integer) based on the data strobe signal DQSL. In more detail, as shown in FIG. 5, the input latch signal generator 121 sequentially generates the input latch signals DLST1 to DLSTK in synchronization with the rising edges of the data strobe signal DQSL. As a result, the input latch signals DLST1 to DLSTK are sequentially enabled.

The divider 122 divides the data strobe signal DQSL into a predetermined number (for example, 2) and outputs a divided signal DVDQS.

The strobe pulse generator 123 generates strobe pulse signals SP1, SP2 based on the divided signal DVDQS. The strobe pulse signals SP1, SP2 may be preferably pulse signals that are enabled at the same time after a predetermined time from a point of time at which a write instruction WT has been generated as shown in FIG. 5. Though not shown in FIG. 3, the strobe pulse generator 123 may be implemented using a variety of circuits or logic circuits that generate the pulse signals.

The output latch signal generator 130 generates an output latch signal DINSTP in response to a clock signal CK and the write instruction WT.

The data input buffers DB1 to DBJ receive external input data EDI1 to EDIJ, respectively, in response to the data input signal ENDI and output input data DI1 to DIJ, respectively. In more detail, in a similar way to the strobe buffer 110, the data input buffers DB1 to DBJ convert voltage levels of the external input data EDI1 to EDIJ into CMOS logic levels and output the input data DI1 to DIJ.

The latches DL1 to DLJ latch the input data DI1 to DIJ, respectively, in response to the input latch signals DLST1 to DLSTK and output latched data LDT1 to LDTJ, respectively. In more detail, each of the input data DI1 to DIJ includes a plurality of bits (for example, K bits).

For example, the latch DL1 may latch bits B11 to B1K of the input data DI1 in response to the input latch signals DLST1 to DLSTK, which are sequentially enabled, and output the bits B11 to B1K as the latched data LDT1 in parallel. The latches DL2 to DLJ perform the same operation as that of the latch DL1.

The multiplexers MX1 to MXJ receive the latched data LDT1 to LDTJ, respectively. The multiplexers MX1 to MXJ may operate in a normal mode or a test mode in response to a test mode signal TM.

For example, the multiplexers MX1 to MXJ may output the latched data LDT1 to LDTJ as multiplexed data MDT1 to MDTJ, respectively, in the normal mode. Furthermore, the multiplexers MX1 to MXJ may generate test data (not shown) and output the test data as the multiplexed data MDT1 to MDTJ, respectively, in the test mode. Each of the multiplexed data MDT1 to MDTJ may be K bits. For example, the multiplexed data MDT1 may include bits X11 to X1K.

The data sense amplifiers DSA1 to DSAJ sense and amplify the multiplexed data MDT1 to MDTJ, respectively, in response to the strobe pulse signals SP1, SP2 and output amplified data AMDI1 to AMDIJ to global I/O lines GIO11 to GIOJK, respectively, in response to the output latch signal DINSTP.

In more detail, each of the data sense amplifiers DSA1 to DSAJ includes sense amplifier circuits and output latch circuits. The construction and operation of each of the data sense amplifiers DSA1 to DSAJ is the same, and only the data sense amplifier DSA1 will be described below as an example.

The data sense amplifier DSA1 includes sense amplifier circuits SA11 to SA1K and output latch circuits OLT11 to OLT1K.

The sense amplifier circuits SA11 to SA1K sense and amplify bits X11 to X1K of the multiplexed data MDT1, respectively, in response to the pulse signals SP1, SP2 and output the sensing signals AD11 to AD1K, respectively. The output latch circuits OLT11 to OLT1K latch the sensing signals AD11 to AD1K, respectively, in response to the output latch signal DINSTP and output latched sensing signals AD11 to AD1K to the global I/O lines GIO11 to GIO1K, respectively, as the bits ADI11 to ADI1K of the amplified data AMDI1, respectively.

Figure 4:
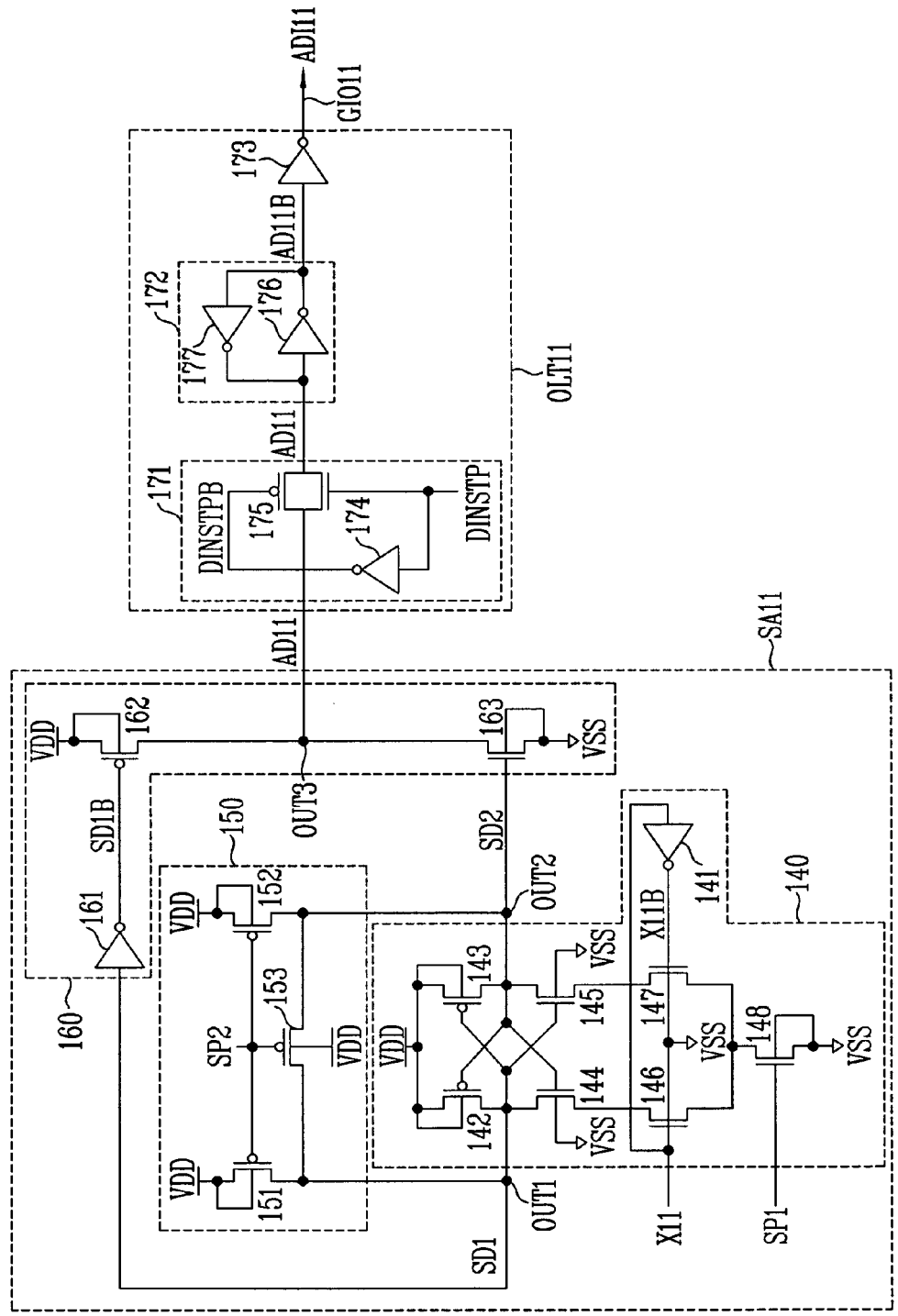
FIG. 4 is a detailed circuit diagram of a sense amplifier circuit and an output latch circuit shown in FIG. 3 according to an embodiment of the present invention.

The constructions and operations of the sense amplifier circuits SA11 to SA1K and the output latch circuits OLT11 to OLT1K will be described in more detail below with reference to FIG. 4. The constructions and operations of the sense amplifier circuits SA11 to SA1K and the output latch circuits OLT11 to OLT1K are the same. Accordingly, only the constructions and operations of the sense amplifier circuit SA11 and the output latch circuit OLT11 will be described below with reference to FIG. 4.

The sense amplifier circuit SA11 includes a sense amplifier 140, an initialization circuit 150, and a driver circuit 160.

The sense amplifier 140 includes an inverter 141, PMOS transistors 142, 143, and NMOS transistors 144 to 148. The inverter 141 inverts a bit X11 and outputs an inverted signal X11B. The PMOS transistors 142, 143 and the NMOS transistors 144, 145 are connected in a cross-coupled manner.

In more detail, the PMOS transistors 142, 143 have sources connected to an internal voltage VDD. The PMOS transistor 142 has a drain connected to an output node OUT1 and a gate connected to an output node OUT2. Furthermore, the PMOS transistor 143 has a drain connected to the output node OUT2 and a gate connected to the output node OUT1. The NMOS transistor 144 has a drain connected to the output node OUT1 and a gate connected to the output node OUT2. In addition, the NMOS transistor 145 has a drain connected to the output node OUT2 and a gate connected to the output node OUT1.

As a result, the PMOS transistor 143 and the NMOS transistor 145 are respectively turned on or off according to a voltage level of the output node OUT1. The PMOS transistor 142 and the NMOS transistor 144 are respectively turned on or off according to a voltage level of the output node OUT2.

The NMOS transistor 146 has a drain connected to a source of the NMOS transistor 144 and has a gate to which the bit X11 is inputted. The NMOS transistor 147 has a drain connected to a source of the NMOS transistor 145 and has a gate to which the inverted signal X11B is inputted. The NMOS transistor 148 has a drain connected to sources of the NMOS transistors 146, 147 and has a source connected to a ground voltage VSS.

Furthermore, the NMOS transistor 148 has a drain to which a strobe pulse signal SP1 is inputted. The NMOS transistor 148 is turned on or off in response to the strobe pulse signal SP1. Preferably, when the NMOS transistor 148 is turned on, the sense amplifier 140 is enabled to sense and amplify a fine difference between the bit X11 and the inverted signal X11B and then to output the output signals SD1, SD2 to the output nodes OUT1, OUT2.

The initialization circuit 150 includes PMOS transistors 151 to 153. The PMOS transistors 151, 152 have sources to which the internal voltage VDD is respectively inputted. The PMOS transistor 151 has a drain connected to the output node OUT1 and the PMOS transistor 152 has a drain connected to the output node OUT2. Furthermore, the PMOS transistor 153 has a source and drain respectively connected to the output nodes OUT1, OUT2. The PMOS transistors 151 to 153 have gates to which a strobe pulse signal SP2 is inputted.

As a result, the PMOS transistors 151 to 153 are turned on or off at the same time in response to the strobe pulse signal SP2. When the PMOS transistors 151 to 153 are turned on, the internal voltage VDD is applied to the output nodes OUT1, OUT2, so that the sense amplifier 140 is initialized. The initialization circuit 150 may stop the operation of supplying the internal voltage VDD to the output nodes OUT1, OUT2 when the sense amplifier 140 is enabled to execute the sensing and amplification operations.

In other words, when the sense amplifier 140 is enabled, the PMOS transistors 151 to 153 of the initialization circuit 150 are turned off. As a result, during the sensing and amplification operations of the sense amplifier 140, the initialization circuit 150 has no effect on the voltage levels of the output nodes OUT1, OUT2.

Thereafter, if the sensing and amplification operations of the sense amplifier 140 are finished, the initialization circuit 150 supplies the output nodes OUT1, OUT2 with the internal voltage VDD, thus initializing the sense amplifier 140.

The driver circuit 160 includes an inverter 161, a PMOS transistor 162, and a NMOS transistor 163.

The inverter 161 inverts the output signal SD1 received from the output node OUT1 and outputs an inverted signal SD1B. The PMOS transistor 162 is connected between the internal voltage VDD and an output node OUT3 and is turned on or off in response to the inverted signal SD1B. The NMOS transistor 163 is connected between the output node OUT3 and the ground voltage VSS and is turned on or off in response to the output signal SD2. The driver circuit 160 outputs the sensing signal AD11 to the output node OUT3 in response to the output signals SD1, SD2.

The output latch circuit OLTI includes a pass circuit 171, a latch circuit 172, and an inverter 173.

The pass circuit 171 includes an inverter 174 and a transfer gate 175. The inverter 174 inverts an output latch signal DINSTP and outputs an inverted output latch signal DINSTPB. The transfer gate 175 is turned on or off in response to the output latch signal DINSTP and the inverted output latch signal DINSTPB. When being turned on, the transfer gate 175 receives the sensing signal AD11 and output it to the latch circuit 172. When the output latch signal DINSTP is enabled, the transfer gate 175 is turned on.

The latch circuit 172 includes inverters 176, 177. The latch circuit 172 latches the sensing signal AD11 received from the transfer gate 175 and outputs a latch signal AD11B. The inverter 173 inverts the latch signal AD11B and outputs an inverted signal to the global I/O line G1011 as the bit ADI11 of the amplified data AMDI1.

The operation of the data input circuit 100 will be described in detail below with reference to FIG. 5.

The data input signal ENDI is first enabled. The external data strobe signal EDQS is inputted to the strobe buffer 110 and the external input data EDI1 to EDIJ are inputted to the data input buffers DB1 to DBJ, respectively. The strobe buffer 110 receives the external data strobe signal EDQS in response to the data input signal ENDI and outputs the data strobe signal DQSL.

Furthermore, the data input buffers DB1 to DBJ receive the external input data EDI1 to EDIJ, respectively, in response to the data input signal ENDI and output the input data DI1 to DIJ, respectively. The input latch signal generator 121 of the input controller 120 sequentially enables the input latch signals DLST1 to DLSTK based on the data strobe signal DQSL and outputs the enabled signals. The latches DL1 to DLJ latch the input data DI1 to DIJ, respectively, in response to the input latch signals DLST1 to DLSTK and output the latched data LDT1 to LDTJ, respectively.

In the case where the test mode signal TM is disabled (i.e., in the case of normal mode), the multiplexers MX1 to MXJ output the bits B11 to B1K, ..., BJ1 to BJK of the latched data LDT1 to LDTJ as the bits X11 to X1K, ..., XJ1 to XJK of the multiplexed data MDT1 to MDTJ, respectively.

Meanwhile, the divider 122 of the input controller 120 divides the data strobe signal DQSL and outputs the divided signal DVDQS. For example, the divider 122 may divide the data strobe signal DQSL twice. In this case, although FIG. 5 does not show a timing diagram of the divided signal DVDQS, the cycle of the divided signal DVDQS becomes twice the data strobe signal DQSL.

Furthermore, the strobe pulse generator 123 of the input controller 120 generates the strobe pulse signals SP1, SP2 based on the divided signal DVDQS. The strobe pulse signals SP1, SP2 may be enabled at the same time in a pulse signal form after a predetermined time elapses from a point of time at which the write instruction WT has been generated. In this case, since the strobe pulse signals SP1, SP2 are generated based on the data strobe signal DQSL, they are influenced by variation in the data strobe signal DQSL (i.e., external data strobe signal EDQS).

In more detail, for example, if a time (tDQSS) from a point of time at which the write instruction WT is inputted to the data input circuit 100 to a point of time at which a first rising edge of the external data strobe signal EDQS is generated is changed, the input controller 120 changes enable time points of the strobe pulse signals SP1, SP2 in proportion to the time (tDQSS).

FIG. 5 shows a timing diagram of signals related to the operation of the data input circuit 100 when the time (tDQSS) is the minimum (tDQSSmin) and a timing diagram of signals related to the operation of the data input circuit 100 when the time (tDQSS) is the maximum (tDQSSmax).

Hereinafter, the operations of the data sense amplifiers DSA1 to DSAJ when the time (tDQSS) is the minimum (tDQSSmin) and the operations of the data sense amplifiers DSA1 to DSAJ when the time (tDQSS) is the maximum (tDQSSmax) will be compared and described.

As shown in FIG. 5, the external data strobe signal EDQS input to the strobe buffer 110 when the time (tDQSS) is the maximum (tDQSSmax) (hereinafter, referred to as a "second case") is ΔT later than those when the time (tDQSS) is the minimum (tDQSSmin) (hereinafter, referred to as a "first case"). As a result, the points of time at which the latches DL1 to DLJ latch the input data DI1 to DIJ, respectively, are slower in the second case than in the first case.

Furthermore, the points of time at which the multiplexers MX1 to MXJ output the multiplexed data MDT1 to MDTJ, respectively, are later in the second case (at this time, the output time point is D3) than in the first case (at this time, the output time point is D1).

Meanwhile, the input controller 120 controls enable time points of the strobe pulse signals SP1, SP2 according to variation in the time (tDQSS). That is, the input controller 120 enables the strobe pulse signals SP1, SP2 at the point of time D2 in the first case, and enables the strobe pulse signals SP1, SP2 at the point of time D4, which is later than the point of time D2, in the second case. Consequently, there is a difference of a time T15 between the enable time point D2 of the strobe pulse signals SP1, SP2 in the first case and the enable time point D4 of the strobe pulse signals SP1, SP2 in the second case.

Furthermore, points of time at which the sense amplifier circuits SA11 to SA1K, ..., SAJ1 to SAJK of the data sense amplifiers DSA1 to DSAJ begin operating are different in the first case and the second case.

As a result, when the points of time at which the multiplexers MX1 to MXJ output the multiplexed data MDT1 to MDTJ become slow, the points of time at which the sense amplifier circuits SA11 to SA1K, ..., SAJ1 to SAJK begin operating also become slow. Furthermore, when the points of time at which the multiplexers MX1 to MXJ output the multiplexed data MDT1 to MDTJ become fast, the points of time at which the sense amplifier circuits SA11 to SA1K, SAJ1 to SAJK begin operating also become fast.

As a result, the time (T11) between the points of time D1, D2 and the time (T12) between the points of time D3, D4 become the same, and the time (T13) between the points of time D5, D6 and the time (T14) between the points of time D7, D8 become the same. Accordingly, data input margin can be secured stably.

Thereafter, the output latch signal generator 130 generates the output latch signal DINSTP in response to the clock signal CK and the write instruction WT. The output latch circuits OLT11 to OLT1K, ..., OLTJ1 to OLTJK of the data sense amplifiers DSA1 to DSAJ latch the sensing signals AD11 to AD1K, ..., ADJ1 to ADJK received from the sense amplifier circuits SA11 to SA1K, ..., SAJ1 to SAJK, respectively, in response to the output latch signal DINSTP and output latched signals to the global I/O lines GIO11 to GIO1K, ..., GIOJ1 to GIOJK as the bits ADI11 to ADI1K, ..., ADIJ1 to ADIJK of the amplified data AMDI1 to AMDIJ, respectively.

As described above, the data input circuit 100 changes the operating start points of the sense amplifier units DSA1 to DSAJ as the time (tDQSS) of the external data strobe signal EDQS is changed. It is therefore possible to secure data input margin stably.

Figure 6:
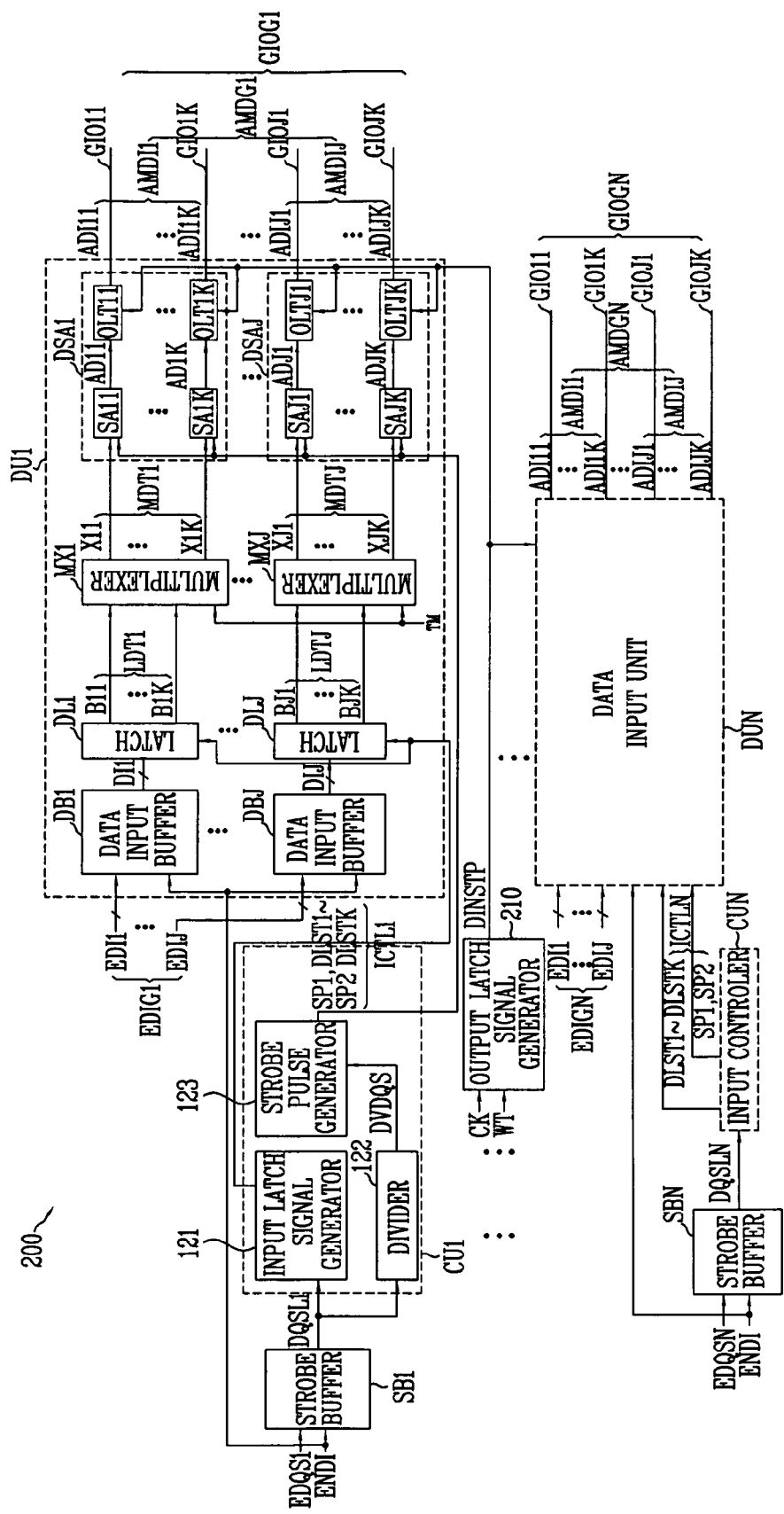
FIG. 6 is a schematic block diagram of a data input circuit of a semiconductor memory device according to another embodiment of the present invention.

FIG. 6 is a schematic block diagram of a data input circuit of a semiconductor memory device according to another embodiment of the present invention.

Referring to FIG. 6, a data input circuit 200 include strobe buffers SB1 to SBN (N is an integer), input controllers CU1 to CUN, data input units DU1 to DUN, and an output latch signal generator 210.

The strobe buffers SB1 to SBN receive external data strobe signals EDQS1 to EDQSN, respectively, in response to a data input signal ENDI and output data strobe signals DQSL1 to DQSLN, respectively.

The input controllers CU1 to CUN generate input control signals ICTL1 to ICTLN, respectively, based on the data strobe signals DQSL1 to DQSLN, respectively. Each of the input control signals ICTL1 to ICTLN includes strobe pulse signals SP1, SP2 and input latch signals DLST1 to DLSTK.

Furthermore, each of the input controllers CU1 to CUN includes an input latch signal generator 121, a divider 122, and a strobe pulse generator 123. The operations of the input latch signal generator 121, the divider 122, and the strobe pulse generator 123 are substantially the same as those that have been described with reference to FIG. 3. Description thereof will be omitted.

The data input units DU1 to DUN receive first to $N^{th}$ groups (EDIG1 to EDIGN) of external input data EDI1 to EDIJ (J is an integer), respectively, in response to the data input signal ENDI. The data input units DU1 to DUN output first to $N^{th}$ groups (AMDG1 to AMDGN) of amplified data AMDI1 to AMDIJ to first to $N^{th}$ groups (GIOG1 to GIOGN) of global I/O lines GIO11 to GIO1K, ..., GIOJ1 to GIOJK, respectively, in response to the input control signals ICTL1 to ICTLN and an output latch signal DINSTP.

The data input units DU1 to DUN have the same construction and operation and only the data input unit DU1 will be described below as an example.

The data input unit DU1 includes data input buffers DB1 to DBJ, latches DL1 to DLJ, multiplexers MX1 to MXJ, and sense amplifier units DSA1 to DSAJ. The construction and operation of the data input buffers DB1 to DBJ, the latches DL1 to DLJ, the multiplexers MX1 to MXJ, and the sense amplifier units DSA1 to DSAJ are substantially the same as those that have been described with reference to FIG. 3. Description thereof will be omitted.

The output latch signal generator 210 generates the output latch signal DINSTP in response to a clock signal CK and a write instruction WT. As described above, in the data input circuit 200, one of external data strobe signal EDQS1 to EDQSN input to the strobe buffers SB1 to SBN, respectively, controls the operation of latches having a predetermined number.

For example, in the case where four data input buffers are included in each of the data input units DU1 to DUN, an external data strobe signal input to one strobe buffer controls the latch operation of the input data input to the four data input buffers.

Hereinafter, the operation of the data input circuit 200 will be described in detail with reference to FIG. 7. The operation of the data input circuit 200 is similar to that of the data input circuit 100. Accordingly, in the present embodiment, only the difference between the operations of the data input circuits 200, 100 will be described.

Figure 7:
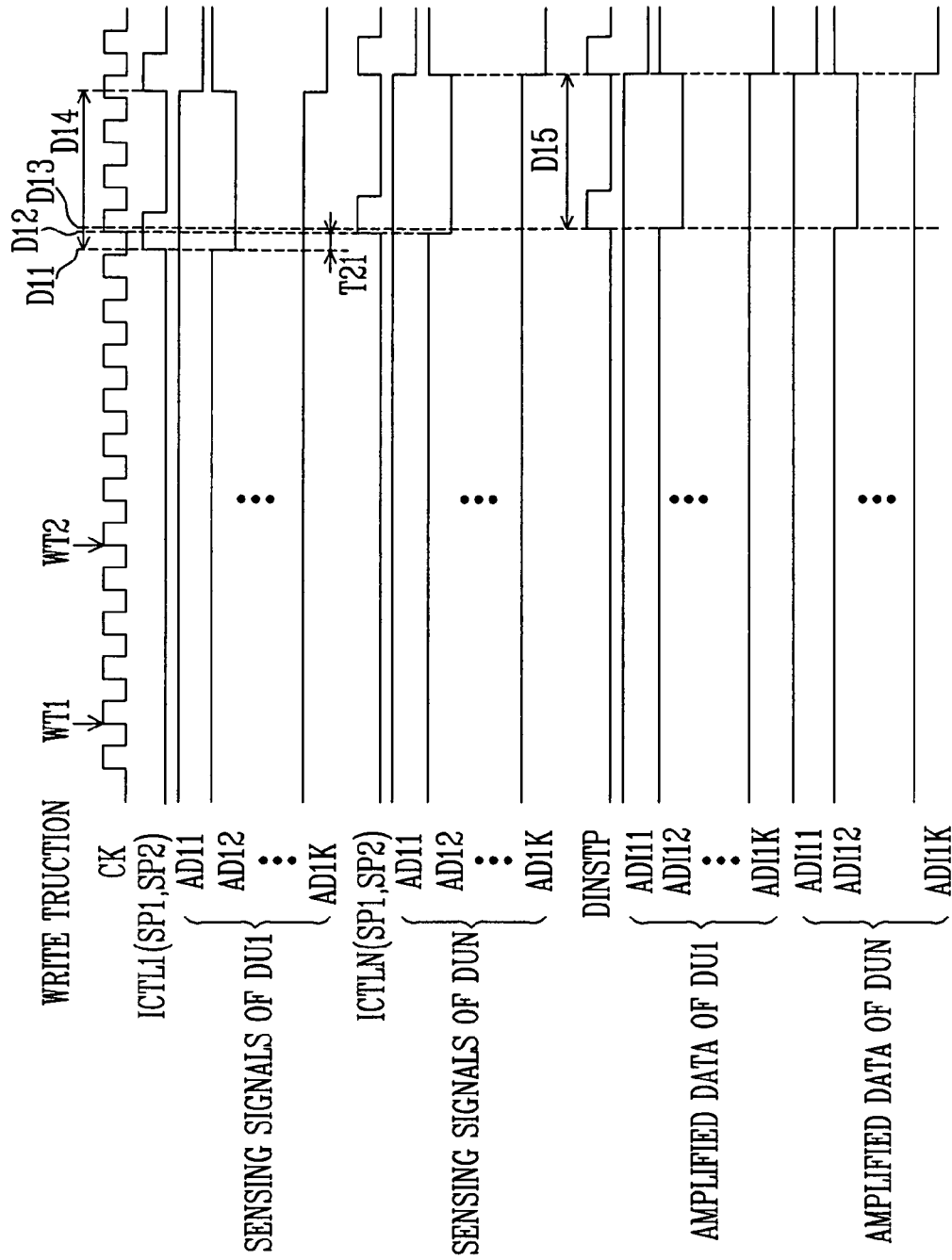
FIG. 7 is a timing diagram of signals related to the operation of the data input circuit shown in FIG. 6 according to an embodiment of the present invention.

FIG. 7 is a timing diagram of signals related to the operation of the data input circuit 200 in the case where the write instructions WT1, WT2 are sequentially inputted to the semiconductor memory device including the data input circuit 200.

As shown in FIG. 7, the strobe pulse signals SP1, SP2 are enabled twice with a time difference D14 therebetween corresponding to the write instructions WT1, WT2, respectively, and the output latch signals DINSTP are also enabled twice with a time difference D15 therebetween. Times (tDQSS) of the external data strobe signals EDQS1 to EDQSN input to the strobe buffers SB1 to SBN, respectively, may be different.

For example, a case in which the time (tDQSS) of the external data strobe signal EDQS1 is the minimum tDQSSmin and the time (tDQSS) of the external data strobe signal EDQSN is the maximum tDQSSmax may exist. In this case, as shown in FIG. 7, a point of time D11 at which the sense amplifier circuits SA11 to SA1K, ..., SAJ1 to SAJK of the data input unit DU1 output the sensing signals AD11 to AD1K, ..., ADJ1 to ADJK, respectively, is T21 earlier than a point of time D12 at which the sense amplifier circuits SA11 to SA1K, ..., SAJ1 to SAJK of the data input unit DUN output the sensing signals AD11 to AD1K, ..., ADJ1 to ADJK, respectively.

The reason why the points of time at which the sense amplifier circuits of the data input units DU1 to DUN output the sensing signals are different as described above is that the input control signals ICTL1 to ICTLN are generated based on the external data strobe signals EDQS1 to EDQSN.

In other words, as the time (tDQSS) of each of the external data strobe signals EDQS1 to EDQSN varies, each of the input controllers CU1 to CUN changes the enable time points of the strobe pulse signals SP1, SP2 of each of the input control signals ICTL1 to ICTLN.

Meanwhile, the output latch signal generator 210 generates the output latch signal DINSTP based on the clock signal CK and the write instruction WT.

In more detail, after the write instruction WT is inputted, the output latch signal generator 210 enables the output latch signal DINSTP in a pulse signal form after a predetermined number of cycles of the clock signal. At this time, the output latch signal DINSTP may be preferably enabled after a point of time D12 at which one of the data input units DU1 to DUN, which performs the sensing and amplification operations most late, outputs the sensing signals AD11 to ADIK, ..., ADJ1 to ADJK.

That is, an enable time point of the output latch signal DINSTP may be decided on the basis of the operation of one of the data input units DU1 to DUN that operate in synchronization with one of the external data strobe signals EDQS1 to EDQSN whose time (tDQSS) is the maximum tDQSSmax.

Accordingly, the output latch signal generator 210 enables the output latch signal DINSTP after the point of time D12, which is the most late. As a result, although points of time at which the data input units DU1 to DUN output the sensing signals AD11 to AD1K, ..., ADJ1 to ADJK, respectively, are different, the data input units DU1 to DUN operate in synchronization with the output latch signal DINSTP.

As a result, the data input units DU1 to DUN output the first to $N^{th}$ groups (AMDG1 to AMDGN) of the amplified data AMDI1 to AMDIJ to the first to $N^{th}$ groups (GIOG1 to GIOGN) of the global I/O lines GIO11 to GIO1K, . . . , GIOJ1 to GIOJK, respectively, at the same time.

Consequently, as shown in FIG. 7, the first to $N^{th}$ groups (AMDG1 to AMDGN) of the amplified data AMDI1 to AMDIJ are uploaded onto the first to $N^{th}$ groups (GIOG1 to GIOGN) of the global I/O lines GIO11 to GIO1K, . . . , GIOJ1 to GIOJK at the point of time D13 at the same time.

As described above, the data input circuit 200 controls the start time points of the sensing and amplification operations of the data input units DU1 to DUN when the times (tDQSS) of the external data strobe signals EDQS1 to EDQSN are changed. It is therefore possible to secure data input margin stability.

Furthermore, the data input units DU1 to DUN output the first to $N^{th}$ groups (AMDG1 to AMDGN) of the amplified data AMDI1 to AMDIJ at the same time in synchronization with the output latch signal DINSTP that is not influenced by variation in the external data strobe signals EDQS1 to EDQSN.

Accordingly, the difference between time points at which the first to $N^{th}$ groups (AMDG1 to ANDGN) of the amplified data AMDI1 to AMDIJ are uploaded onto the first to $N^{th}$ groups (GIOG1 to GIOGN) of the global I/O lines GIO11 to GIO1K, . . . , GIOJ1 to GIOJK, which may occur because the points of time of the sensing and amplification operations of the data input units DU1 to DUN are different, can be neglected.

As described above, in accordance with a data input circuit of a semiconductor memory device and a data input operating method thereof according to the present invention, an operating start point of a sense amplifier circuit is controlled according to variation in a data strobe signal. It is therefore possible to secure data input margin stability.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A data input circuit of a semiconductor memory device, the data input circuit comprising:
    a strobe buffer that receives an external data strobe signal in response to a data input signal and outputs a data strobe signal;
    data input buffers that receive external input data, respectively, in response to the data input signal and output input data, respectively;
    an input controller that generates input latch signals and strobe pulse signals based on the data strobe signal;
    an output latch signal generator that generates an output latch signal in response to a clock signal and a write instruction;
    latches that latch the input data, respectively, in response to the input latch signals and output latch data, respectively;
    multiplexers that receive the latch data, respectively, and output multiplexed data, respectively; and
    data sense amplifiers that sense and amplify the multiplexed data, respectively, in response to the strobe pulse signals and output amplified data to global I/O lines, respectively, in response to the output latch signal.

2. The data input circuit as claimed in claim 1, wherein when a first set time from when the write instruction is generated to when a first rising edge of the data strobe signal is generated is changed, the input controller changes output time points of the input latch signals and output time points of the strobe pulse signals, respectively, in proportion to the first set time.

3. The data input circuit as claimed in claim 1, wherein the input controller comprises:
    an input latch signal generator that generates the input latch signals based on the data strobe signal;
    a divider that divides the data strobe signal into P numbers (P is an integer) and outputs divided signals; and
    a strobe pulse generator that generates the strobe pulse signals based on the divided signal.

4. The data input circuit as claimed in claim 1, wherein each of the input data includes K bits (K is an integer),
    the inputted latch signals include first to $K^{th}$ input latch signals, and
    each of the latches latches K bits of one of the input data in response to the first to $K^{th}$ input latch signals and outputs latched K bits as one of the latch data in parallel.

5. The data input circuit as claimed in claim 1, wherein each of the multiplexers operates in a normal mode or a test mode in response to a test mode signal, and
    the multiplexers output the latch data as the multiplexed data, respectively, in the normal mode, and generate test data and output the test data as the multiplexed data, respectively, in the test mode.

6. The data input circuit as claimed in claim 1, wherein each of the multiplexed data includes K bits (K is an integer),
    each of the amplified data includes the K bits, and
    each of the data sense amplifiers comprises:
    sense amplifier circuits that sense and amplify K bits of one of the multiplexed data, respectively, in response to the strobe pulse signals and output first to $K^{th}$ sensing signals, respectively; and
    output latch circuits that latch the first to $K^{th}$ sensing signals, respectively, in response to the output latch signal and output the latched first to $K^{th}$ sensing signals to a portion of the global I/O lines, respectively, as K bits of one of the amplified data.

7. The data input circuit as claimed in claim 6, wherein the strobe pulse signals include a first strobe pulse signal and a second strobe pulse signal, and
    each of the sense amplifier circuits comprises:
    a sense amplifier that senses and amplifies one of the K bits of one of the multiplexed data in response to the first strobe pulse signal and outputs one of the first to $K^{th}$ sensing signals to an output node;
    an initialization circuit that supplies an internal voltage to the output node in response to the second strobe pulse signal and
    a driver circuit that outputs one of K bits of one of the amplified data to one of the global I/O lines in response to one of the first to $K^{th}$ sensing signals received from the output node.

8. The data input circuit as claimed in claim 6, wherein the output latch circuits latch K bits of one of the amplified data at the same time in response to the output latch signal, and output the latched K bits to a portion of the global I/O lines, respectively.

9. The data input circuit as claimed in claim 7, wherein when the sense amplifier executes sensing and amplification operations, the initialization circuit stops the supply of the internal voltage to the output node.

10. The data input circuit as claimed in claim 2, wherein a time from when the multiplexers output the multiplexed data to when the input controller outputs the strobe pulse signals, when the first set time is the maximum, is the same as a time form when the multiplexers output the multiplexed data to when the input controller outputs the strobe pulse signals, when the first set time is the minimum.

11. A data input circuit of a semiconductor memory device, the data input circuit comprising:
first to $N^{th}$ strobe buffers that receive first to $N^{th}$ (N is an integer) external data strobe signals, respectively, in response to a data input signal and output first to $N^{th}$ data strobe signals, respectively;
first to $N^{th}$ input controllers that generate first to $N^{th}$ input control signals, respectively, based on the first to $N^{th}$ data strobe signals, respectively;
an output latch signal generator that generates an output latch signal in response to a clock signal and a write instruction; and
first to $N^{th}$ data input units that receive first to $N^{th}$ groups of external input data, respectively, in response to the data input signal, latch and sense the first to $N^{th}$ groups of the external input data, respectively, in response to the first to $N^{th}$ input control signals, respectively, and output first to $N^{th}$ groups of amplified data to first to $N^{th}$ groups of global I/O lines, respectively.

12. The data input circuit as claimed in claim 11, wherein each of the first to $N^{th}$ input control signals includes input latch signals and strobe pulse signals, and
when a first set time that is taken from when the write instruction is generated to when a first rising edge of one of the first to $N^{th}$ data strobe signals is generated is changed, each of the first to $N^{th}$ input controllers changes output time points of the input latch signals and output time points of the strobe pulse signals in proportion to the first set time.

13. The data input circuit as claimed in claim 12, wherein each of the first to $N^{th}$ input controllers comprises:
an input latch signal generator that generates the input latch signals based on one of the first to $N^{th}$ data strobe signals;
a divider that divides one of the first to $N^{th}$ data strobe signals into P numbers (P is an integer) and outputs divided signals; and
a strobe pulse generator that generates the strobe pulse signals based on the divided signals.

14. The data input circuit as claimed in claim 12, wherein each of the first to $N^{th}$ data input units comprises:
data input buffers that receive external input data of one of the first to $N^{th}$ groups, respectively, in response to the data input signal and output input data, respectively;
latches that latch the input data, respectively, in response to the input latch signals of one of the first to $N^{th}$ input control signals and output latch data, respectively;
multiplexers that receive the latch data, respectively, and output multiplexed data, respectively; and
data sense amplifiers that sense and amplify the multiplexed data, respectively, in response to the strobe pulse signals of one of the first to $N^{th}$ input control signals, and output amplified data of one of the first to $N^{th}$ groups to global I/O lines of one of the first to $N^{th}$ groups, respectively, in response to the output latch signal.

15. The data input circuit as claimed in claim 14, wherein each of the multiplexed data includes K bits (K is an integer), each of amplified data of each of the first to $N^{th}$ groups includes the K bits, and
each of the data sense amplifiers comprises:
sense amplifier circuits that sense and amplify K bits of one of the multiplexed data in response to the strobe pulse signals and output first to $K^{th}$ sensing signals, respectively; and
output latch circuits that latch the first to $K^{th}$ sensing signals, respectively, in response to the output latch signal and output latched first to $K^{th}$ sensing signals to a portion of global I/O lines of one of the first to $N^{th}$ groups, respectively, as one of amplified data of one of the first to $N^{th}$ groups.

16. The data input circuit as claimed in claim 15, wherein the strobe pulse signals include a first strobe pulse signal and a second strobe pulse signal, and
each of the sense amplifier circuits comprises:
a sense amplifier that senses one of the K bits of one of the multiplexed data in response to the first strobe pulse signal and outputs one of the first to $K^{th}$ sensing signals to an output node;
an initialization circuit that supplies an internal voltage to the output node in response to the second strobe pulse signal; and
a driver circuit that outputs one of K bits of one of amplified data of one of the first to $N^{th}$ groups to global I/O lines of one of the first to $N^{th}$ groups in response to one of the first to $K^{th}$ sensing signals received from the output node.

17. The data input circuit as claimed in claim 15, wherein output latch circuits of the first to $N^{th}$ data input units output amplified data of the first to $N^{th}$ groups to the global I/O lines of the first to $N^{th}$ groups, respectively, at the same time in response to the output latch signal, respectively.

18. The data input circuit as claimed in claim 16, wherein when the sense amplifier executes sensing and amplification operations, the initialization circuit stops the supply of the internal voltage to the output node.

19. The data input circuit as claimed in claim 14, wherein a time, which is taken from when the multiplexers of one of the first to $N^{th}$ data input units output the multiplexed data, respectively, to when one of the first to $N^{th}$ input controllers outputs the strobe pulse signals of one of the first to $N^{th}$ input control signals, when the first set time is the maximum, is the same as a time, which is taken from when the multiplexers of one of the first to $N^{th}$ data input units output the multiplexed data, respectively, to when one of the first to $N^{th}$ input controllers outputs the strobe pulse signals of one of the first to $N^{th}$ input control signals when the first set time is the minimum.

20. A data input method of a semiconductor memory device, the data input method comprising the steps of:
receiving an external data strobe signal in response to a data input signal and outputting a data strobe signal;
receiving external input data, respectively, in response to the data input signal and outputting the input data, respectively;
generating input latch signals and strobe pulse signals based on the data strobe signal;
latching the input data, respectively, in response to the input latch signals and outputting latch data, respectively;
receiving the latch data, respectively, and outputting multiplexed data, respectively;
sensing and amplifying the multiplexed data, respectively, in response to the strobe pulse signals and outputting amplified data;
generating an output latch signal in response to a clock signal and a write instruction; and outputting the amplified data to global I/O lines, respectively, in response to the output latch signal.

21. The data input method as claimed in claim 20, wherein in the step of generating the input latch signals and the strobe pulse signals, output time points of the input latch signals and output time points of the strobe pulse signals are changed in proportion to a first set time which is taken from when the write instruction is generated to when a first rising edge of the data strobe signal is generated, when the first set time is changed.

22. The data input method as claimed in claim 20, wherein the step of generating the input latch signals and the strobe pulse signals comprises the steps of:

generating the input latch signals based on the data strobe signal;

dividing the data strobe signal into P numbers (P is an integer) and outputting divided signals; and generating the strobe pulse signals based on the divided signals.

23. The data input method as claimed in claim 21, wherein a time which is taken from an output time point of the multiplexed data to when the step of sensing and amplifying the multiplexed data and outputting the amplified data begins, when the first set time is the maximum, is the same as a time which is taken from an output time point of the multiplexed data to when the step of sensing and amplifying the multiplexed data and outputting the amplified data begins, when the first set time is the minimum.

* * * * *